(12) United States Patent
Ishida et al.

(10) Patent No.: US 7,888,600 B2
(45) Date of Patent: Feb. 15, 2011

(54) CIRCUIT BOARD AND ELECTRICAL CONNECTION BOX HAVING THE SAME

(75) Inventors: Yuichi Ishida, Kakegawa (JP); Masaaki Ishiguro, Kakegawa (JP); Kazuaki Nakamura, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 396 days.

(21) Appl. No.: 11/755,016

(22) Filed: May 30, 2007

(65) Prior Publication Data

US 2007/0277999 A1 Dec. 6, 2007

(30) Foreign Application Priority Data

May 30, 2006 (JP) .......................... P2006-149984

(51) Int. Cl.
*H05K 1/00* (2006.01)
(52) U.S. Cl. ...................... 174/252; 361/709
(58) Field of Classification Search ................. 174/252; 361/702, 709
See application file for complete search history.

(56) References Cited

U.S. PATENT DOCUMENTS 6,222,732 B1 * 4/2001 Jakob et al. ................. 361/704
6,366,264 B1 * 4/2002 Kurumada ................... 345/60
6,768,061 B2 * 7/2004 Kondo ........................ 174/255

FOREIGN PATENT DOCUMENTS

JP 06-169189 * 6/1994
JP 11-163476 A 6/1999

OTHER PUBLICATIONS

Machine Translation of JP 06-169189, Jun. 14, 1994, granted to Hitachi.*

* cited by examiner

*Primary Examiner*—Jeremy C Norris
(74) *Attorney, Agent, or Firm*—Sughrue Mion, PLLC

(57) ABSTRACT

A circuit board includes a metal core having a plate shape, an insulation section covering a surface of the metal core, and a heat radiation section in which the metal core is exposed and which is provided at a circumference of the metal core.

5 Claims, 3 Drawing Sheets

CIRCUIT BOARD AND ELECTRICAL CONNECTION BOX HAVING THE SAME

BACKGROUND OF THE INVENTION

1. Technical Field

The present invention relates to a circuit board for mounting electrical circuits such as power supply circuits, and an electrical connection box containing the circuit board.

2. Related Art

In general, when a circuit board including electrical circuits such as power supply circuits is mounted on the vehicles, the circuit board is accommodated in a box. In this case, when the circuit board is a circuit board including a large-current electrical circuit such as a power supply circuit having a large calorific value, the radiation performance of the box should be enough large.

As a countermeasure for radiating the heat produced from the electrical circuits, as shown in FIG. 6, there is known in the art a circuit board that a radiator plate 2 formed of a metal plate is superimposed on a board 1 and an electrical component 3 is connected to an exposed portion of the radiator plate 2 so as to transmit the heat from the electrical component 3 to the radiator plate 2 (for example, see JP-A-11-163476).

However, in the circuit board, circuits cannot be disposed on the surface to which the radiator plate 2 of board 1 is attached. Furthermore, since the radiator plate 2 is exposed, the mountable area is limited. As a result, in order to secure the necessary mountable area, the board increases in size. Accordingly, when the circuit board is contained in an electrical connection box, the electrical connection box also increases in size.

In addition, since the radiator plate 2 that is a different member from the board 1 is bonded, the number of components and the number of process steps are increased, and then the cost is raised. Further, at the time of disassembling the electrical connection box containing the circuit board, the radiator plate 2 should be detached from the board 1, which requires a much effort for the disassembling.

SUMMARY OF THE INVENTION

An object of the invention is to provide a circuit board having superior soaking and radiation performance and capable of reducing in size and weight, and an electrical connection box having the circuit board.

The object can be accomplished by the following aspects:
(1). A circuit board comprising,
   a metal core having a plate shape;
   an insulation section covering a surface of the metal core; and
   a heat radiation section in which the metal core is exposed and which is provided at a circumference of the metal core.
(2). The circuit board according to (1),
   wherein the metal core in the heat radiation section has at least one of a projection and a recess.
(3). The circuit board according to (1) or (2),
   wherein the heat radiation section is positioned perpendicular to the insulation section.
(4). An electrical connection box comprising:
   a circuit board according to any one of (1) to (3), on which electrical components are mounted; and
   a case covering the circuit board.

According to the circuit board of (1), since the heat radiation section in which the metal core is exposed is provided at the circumference of the metal core, the transferred heat from the electrical component to the metal core can be effectively radiated from the heat radiation section having the exposed metal core. As a result, it is not required for the separate radiator plate made of the metal plate, and the large mounting area can be secured. Simultaneously, due to the simplification of the structure it allows reducing in size and weight, and saving the cost, and also facilitating the disassembly. Hence, the soaking and radiation performance can be improved.

According to the circuit board of (2), the metal core including the heat radiation section has at least one of a projection and a recess. Since the surface area of the heat radiation section including the metal core is increased, the radiation affect can be improved, According to the circuit board of (3), the heat radiation section is positioned perpendicular to the insulation section. Therefore, since size in the plane is decreased, the various devices containing the circuit board can be reduced in size.

According to the electrical connection box of (4), since the box comprises the circuit board including the heat radiation section in which the metal core is exposed is provided to the circumference of the circuit board and thus the transferred heat from the electrical component to the metal core can be effectively radiated, as a result, the larger current than that compared to the case that the circuit board attaching the separate radiator plate made of the metal plate is contained, can be supplied to the circuit board without using a bus bar, and thus the reduction in size and weight, the cost-saving and also easy disassembly can be accomplished. Hence, the soaking and radiation performance can be improved.

According to the invention, it allows obtaining a superior soaking and radiation performance, and also it permits cost-saving and reduction in size and weight.

Thus, the invention has described in general terms. Numerous specific details will become more apparent from the following detailed description of the exemplary embodiments for implementing the invention with reference to the accompanied drawings.

BRIEF DESCRIPTION OF THE INVENTION

DETAILED DESCRIPTION OF THE INVENTION

The circuit board according to an exemplary embodiment of the invention and the electrical connection box including the same will be in more detail described herein below with reference to drawings.

(Circuit Board)

Now, the circuit board according to an exemplary embodiment will be described.

Figure 1:
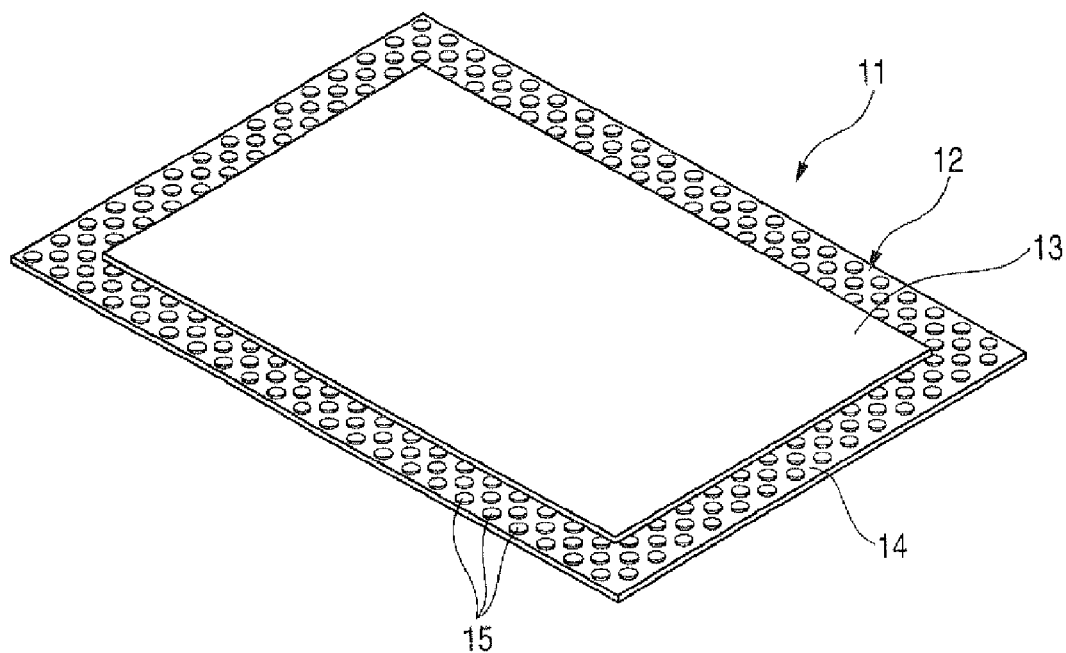
FIG. 1 is a perspective view illustrating the structure of the exemplary circuit board according to an embodiment of the invention.
Figure 2:
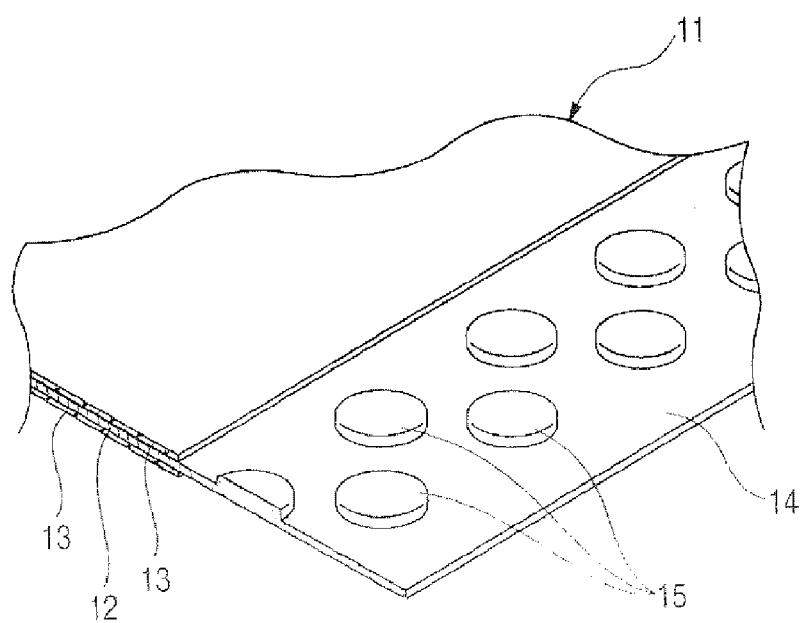
FIG. 2 is an enlarged perspective view illustrating a portion of the circuit board.

FIG. 1 is a perspective view illustrating the structure of the circuit board according to the exemplary embodiment of the invention, and FIG. 2 is an enlarged perspective view illustrating a portion of the circuit board.

As shown in FIGS. 1 and 2, the circuit board 11 includes the plate-like metal core 12 made of the metal core board, and the insulation section 13 formed so as to cover the surface of the metal core 12, and is an electrical circuit board formed by stacking the metal core 12 and the insulation section 13.

The metal core 12, for example, is a plate made of copper. The insulation section 13 is formed by molding glass epoxy resin, etc. having nonconductive property and low heat conductivity. In addition, instead of the copper, aluminum that specific gravity is about one third of copper may be employed as the material of the metal core 12.

On the circuit board 11 made up of the metal core board, the conductive circuit pattern made of copper foil (not shown) is formed in the insulation section 13.

Additionally, the electrical components such as relay (not shown) are mounted on the circuit board 11, and the terminal area of the electrical components is soldered and connected into the wiring pattern.

In the circuit board 11 having the structure, the metal core 12 is exposed by eliminating the insulation section 13 from the circumference, and the portion that the metal core 12 is exposed is formed as the heat radiation section 14.

The metal core 12 included in the heat radiation section 14 is formed in unevenness in such a manner that a plurality of the projection portions 15 are protruded from one side of the surfaces, and these projection portions 15 are arranged in zigzag in a plan view. The projection portions 15 may be protruded from the other side of the surfaces, or both sides of the surfaces. Further, in a plan view, the projection portions 15 may not be arranged in zigzag. In addition, a plurality of recesses may be formed instead of the projection portions 15.

Furthermore, according to the circuit board 11 of the exemplary embodiment, the heat radiation section 14 in which the metal core 12 is exposed is provided to the circumference. As a result, the transferred heat from the electrical component to the metal core 12 can be effectively radiated from the heat radiation section 14 including the exposed metal core 12. Thus, there is no use of the separate radiator plate made up of the metal plate, and the large mounting area can be secured. Simultaneously, due to the simplification of the structure it allows reducing in size and weight, and saving the cost, and also facilitating the disassembly. Hence, the soaking and radiation performance can be improved.

In particular, since the metal core 12 constituting the heat radiation section 14 are formed to be uneven by forming the plurality of projection portions 15, the surface area of the heat radiation section 14 made up of the metal core 12 is largely increased, and thus superior radiation effect can be obtained.

Further, since the heat radiation section 14 of the circuit board 11 is bent in a direction perpendicular to the surface thereof, the size in plane of the circuit board 11 can be decreased and then the size of various devices which contain the circuit board 11 can be reduced.

Figure 3:
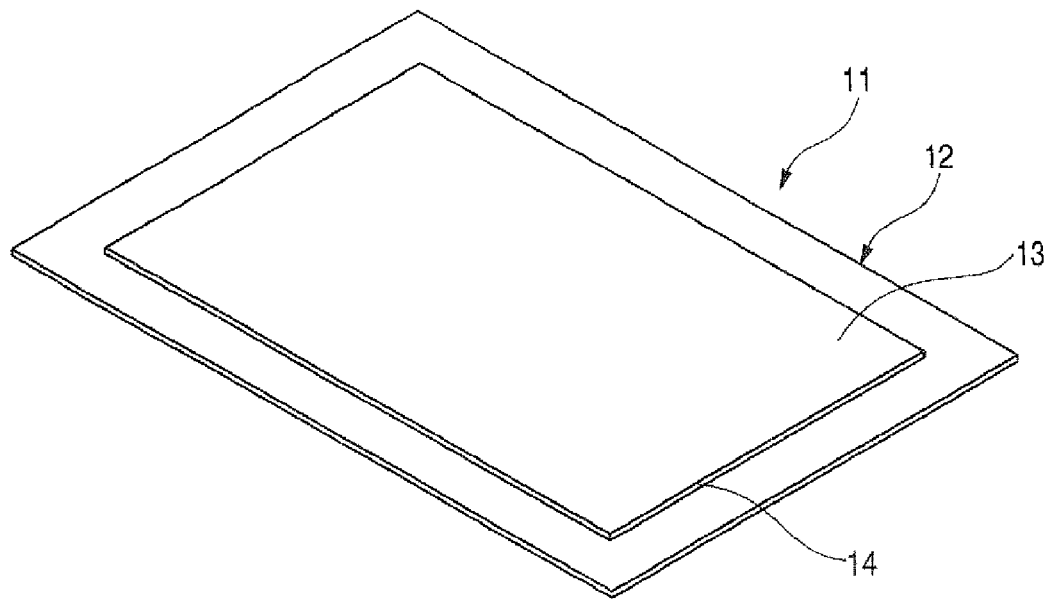
FIG. 3 is a perspective view illustrating another structure of the circuit board.

While the configuration has been described as an example in which a plurality of projection portions 15 are formed in the metal core 12 constituting the heat radiation section 14 in the embodiment, as shown in FIG. 3, superior radiation effect can be obtained even though the configuration of the heat radiation section 14 is employed.

In addition, while the heat radiation section 14 is provided in entire circumference of the circuit board 11, the heat radiation section 14 exposing the metal core 12 may be formed in a portion of the circumference of the circuit board 11.

(Electrical Connection Box)

The electrical connection box according to an exemplary embodiment will be described in detail hereinafter.

Figure 4:
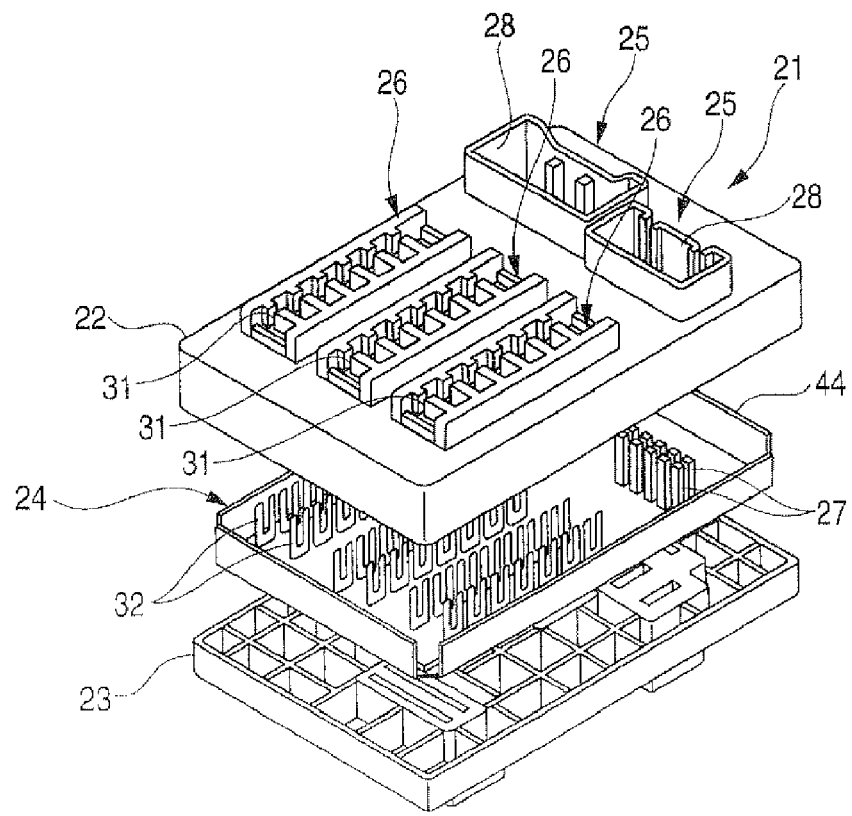
FIG. 4 is an exploded perspective view illustrating the structure of the electrical connection box relating to the exemplary embodiment of the invention.
Figure 5:
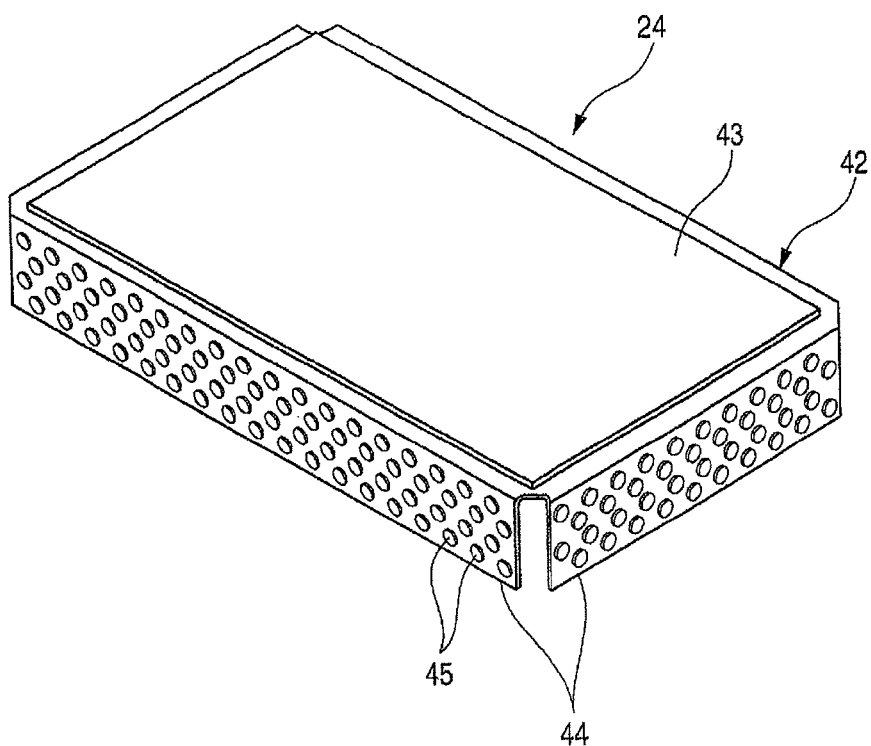
FIG. 5 is an enlarged perspective view illustrating the structure of an exemplary electrical connection box according to an embodiment of the invention.
Figure 6:
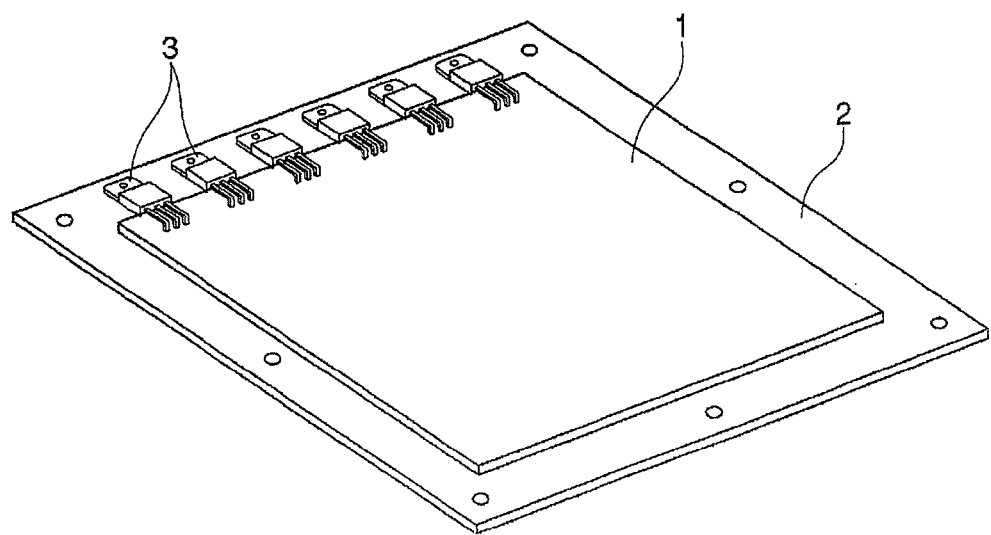
FIG. 6 is a perspective view for describing the related art circuit board.

FIG. 4 is an enlarged perspective view illustrating the structure of the electrical connection box according to an exemplary embodiment of the invention, and FIG. 5 is in a perspective view illustrating the circuit board provided to the electrical connection box, as viewed from the rear side.

As shown in FIG. 4, the electrical connection box 21 has an upper case (case) 22 and a lower case (case) 23. The circuit board 24 is disposed between the upper case 22 and the lower case 23. The circuit board 24 is covered with the upper case 22 and the lower case 23. The wiring pattern (not shown) is formed on the both sides of the circuit board 24. For example, the electrical components (not shown), such as relays, fuses, electronic control units are mounted on the circuit board 24.

The upper case 22 and the lower case 23 are formed by, for example, polypropylene that the glass fiber is incorporated into. The circuit board 24 is sandwiched between the upper case 22 and the lower case 23, and then in the sandwiched state, the circuit board 24 is mounted.

The electrical connection box 21 has a plurality of socket 25 connectable with connectors of the wiring harness.

The socket 25 has an engaging concave portion 28 formed in the upper case 22. The connection terminal 27 is arranged within the engaging concave portion 28, which is uprightly formed so as to electrically connect to the wiring pattern of the circuit board 24. In addition, in the socket 25, the connector of the wiring harness is engaged with the engaging concave portion 28, and then the terminal of the connector is electrically connected to the connection terminal 27 of the socket 25.

Additionally, the electrical connection box 21 has a plurality of component-fixing socket 26 capable of attaching the electrical component, such as an external relay.

These component-fixing socket 26 has an engaging concave portion 31 formed in the upper case 22. The connecting terminal 32 is arranged within the engaging concave portion 31, which is uprightly formed so as to electrically connect to the wiring pattern of the circuit board 24. In addition, in the component-fixing socket 26, the electrical component is engaged with the engaging concave portion 31, and then the connection terminal of the electrical component is electrically connected to the connection terminal, 32 of the component-fixing socket 26.

The circuit board 24 is made up of the metal core board, and has the plate-like metal core 42, and the insulation section 43 formed so as to cover the surface of the metal core 42. The circuit board 24 is an electrical circuit board that the metal core 42 and the insulation section 43 are multilayered.

The metal core 42 is, for example, a plate made of copper. The insulation section 43 is formed by molding glass epoxy resin, etc. having nonconductive property and low heat conductivity. In addition, instead of the copper, aluminum that specific gravity is about one third of copper may be employed as the material of the metal core 42.

On the circuit board 24 made up of the metal core board, the conductive circuit pattern (not shown) made of copper foil is formed in the insulation section 43.

In the circuit board 24 having the structure, the heat radiation section 44 is provided to the circumference. As shown in FIG. 5, the heat radiation section 44 is formed by bending the metal core 42 exposed by eliminating the insulation section 43 toward the rear direction perpendicular to the surface of the circuit board 24, in each side of the circuit 24. That is, the heat radiation section is positioned perpendicular to the insulation section.

In order not to be interfered with the adjacent heat radiation sections 44, it is preferable that the corner of the circuit board 24 is cut out in the plane state and thereafter the heat radiation section 44 is bent.

Further, the metal core 42 included in the heat radiation section 44 is formed in unevenness so that a plurality of the projection portions 45 are protruded from one side of the surfaces, and these projection portions 45 are arranged in zigzag as viewed from a plane.

Furthermore, the electrical connection box 21 having the above structure, the heat from the electrical components mounted on the circuit board 24 is transferred to the metal core 42, and then radiated from the heat radiation section 44 including the metal core 42.

As discussed above, according to the electrical connection box relating to the exemplary embodiment, the heat radiation section 44 formed by exposing the metal core 42 is provided to the circumference. As a result, the circuit board 24 can be obtained in which the heat transferred from the electrical components to the metal core 42 can be effectively radiated from the heat radiation section 44 made up of the exposed metal core 42. According to the circuit board 24, the large current can be introduced to the circuit board 24 without using the bus bar, unlike the case that the circuit board on which a separate radiator plate having a metal plate is attached is accommodated. Further, due to the simplification of structure, the reduction in size and, weight, the cost saving, and also easy disassembly can be accomplished. Hence, the soaking and radiation performance can be improved.

Particularly, since the heat radiation section 44 is bent in a direction perpendicular to the surface thereof, the size in plane of the circuit board 24 can be decreased, and then the electrical connection box 21 can be much reduced in size.

What is claimed is:

1. A circuit board comprising:
a metal core having a plate shape including a first surface and a second surface disposed on the reverse side of the first surface;
an insulation section covering a surface of the metal core; and
a heat radiation section which is intrinsic with the metal core and in which the metal core is exposed and which is provided at a periphery of the metal core, wherein
the heat radiation section has a plurality of projections at the first surface and a plurality of recesses at the second surface corresponding to the projections.

2. The circuit board according to claim 1,
wherein the heat radiation section is positioned perpendicular to the insulation section.

3. An electrical connection box comprising:
a circuit board according to claim 1, on which electrical components are mounted; and
a case covering the circuit board.

4. The circuit board according to claim 1,
wherein a substantial portion of the periphery of the metal core is bent to a substantially perpendicular position relative to the insulation section to thereby allow the periphery to radiate heat away from the circuit board.

5. The circuit board according to claim 1,
wherein the heat radiation section and the metal core are made of copper.

* * * * *